United States Patent

Lonka

[11] Patent Number: 5,365,410
[45] Date of Patent: Nov. 15, 1994

[54] ELECTROMAGNETIC COMPATIBILITY ENCLOSURE

[75] Inventor: Pekka Lonka, Salo, Finland

[73] Assignee: Nokia Mobile Phones Ltd., Salo, Finland

[21] Appl. No.: 963,418

[22] Filed: Oct. 19, 1992

[30] Foreign Application Priority Data

Oct. 22, 1991 [FI] Finland .................................. 917978

[51] Int. Cl.⁵ .................................................. H05K 9/00
[52] U.S. Cl. ...................................... 361/816; 174/35 R
[58] Field of Search ............... 361/400, 401, 403, 404, 361/405, 409, 424, 427, 428, 760–761, 767, 772, 773, 777, 816–818, 825–826; 174/35 R, 35 MS, 35 GC, 35 TS; 336/84; 338/64; 358/254; 439/607, 608, 609, 610; 331/67; 334/85

[56] References Cited

U.S. PATENT DOCUMENTS

| | | | |
|---|---|---|---|
| 3,816,911 | 6/1974 | Knappenberger | 29/626 |
| 4,716,499 | 12/1987 | Bhargava | 361/395 |
| 4,754,101 | 6/1988 | Stickney et al. | 174/35 R |
| 4,838,475 | 6/1989 | Mullins et al. | 361/424 |
| 5,014,160 | 5/1991 | McCoy, Jr. | 361/424 |
| 5,043,848 | 8/1991 | Rogers et al. | 361/424 |

FOREIGN PATENT DOCUMENTS 914978   4/1992   Finland .
1180394  2/1970   United Kingdom .

Primary Examiner—Leo P. Picard
Assistant Examiner—Bot Ledynh
Attorney, Agent, or Firm—Perman & Green

[57] ABSTRACT

The invention relates to an EMC enclosure (4) used in radiotelephones as protection of the radiotelephone components, the enclosure (4) having no separate cover in order to service or to repair the components. Between the cover (16) and the side walls (15) the EMC enclosure has necks (7,11) with openings (8,12,13,14) between them. Due to these openings it is possible to open the cover (16) with a suitable tool. When the cover has (16) been opened it is possible to solder it back or to use a repair cover.

11 Claims, 2 Drawing Sheets

ELECTROMAGNETIC COMPATIBILITY ENCLOSURE

The invention relates to an EMC enclosure with side walls and a cover, which is easy to open for service or repair work the side walls and cover being formed by the same plate preform.

BACKGROUND OF THE INVENTION

EMC or the Electromagnetic Compatibility is defined as the ability of electronic equipment and systems to keep the ratios of useful signals to interference signals such that the performance characteristics of the equipment are not impaired when they are simultaneously used for their intended purpose in an acceptable environment.

The more exacting EMC requirements impose ever more requirements on electric and telecommunications equipment. The equipment must withstand interference of certain type and level. Also the equipment must not radiate too much interference into the environment.

Enclosures must be used in radiotelephones due to the EMC protection in order to decrease radiation emission and to increase the radiation tolerance of sensitive parts. The enclosures will contain several components, requiring a cover which can be opened for service and repair works in order to reach the components inside the casing.

In order to obtain an enclosure which can be opened there is used a separate cover, as is well known, which along its edges can be fastened to the frame of the EMC enclosure, thus coming into an electric and galvanic contact. This known construction has a disadvantage in that manufacturing a separate cover and fastening it to its frame causes material and labour costs. A separate cover also introduces a component item or the radiotelephone, the handling and updating of which causes extra costs.

In the known construction there can be a poor contact between the cover and the frame due to tolerances, or the cover contact could be insufficient, due to oxidation or high frequency characteristics. Then at high frequencies the cover or a part of it will rise to an impedance and begin to radiate or to receive radiation. The protective effect of the EMC enclosure or a part of it is then lost.

In practice there are several enclosed parts within the radio unit, whereby the above mentioned disadvantages have a large effect. On the other hand only a few EMC enclosures must be opened for service or repair. Therefore most covers are unnecessary components, as they must not be opened during the lifetime of the radiotelephone. Individual covers, due to oxidation reasons and the increase of the number of components, partly impair the reliability and further the impairment of performance characteristics due to any internal interferences.

An objective of the present invention is to provide an EMC enclosure, which should be of high quality and save costs compared with prior solutions.

SUMMARY OF THE INVENTION

According to the present invention there is provided an EMC enclosure with side walls and a cover used for providing component protection in an electrical apparatus, characterized in that the side walls and the cover are formed of the same plate preform by bending, and that there is an arrangement in the bending area between the cover and the side walls for opening and closing the enclosure.

BRIEF DESCRIPTION OF THE DRAWINGS

An embodiment of the invention is described in detail below, by way of example, with reference to the accompanying drawings, in which.

DETAILED DESCRIPTION OF THE INVENTION

Figure 1:
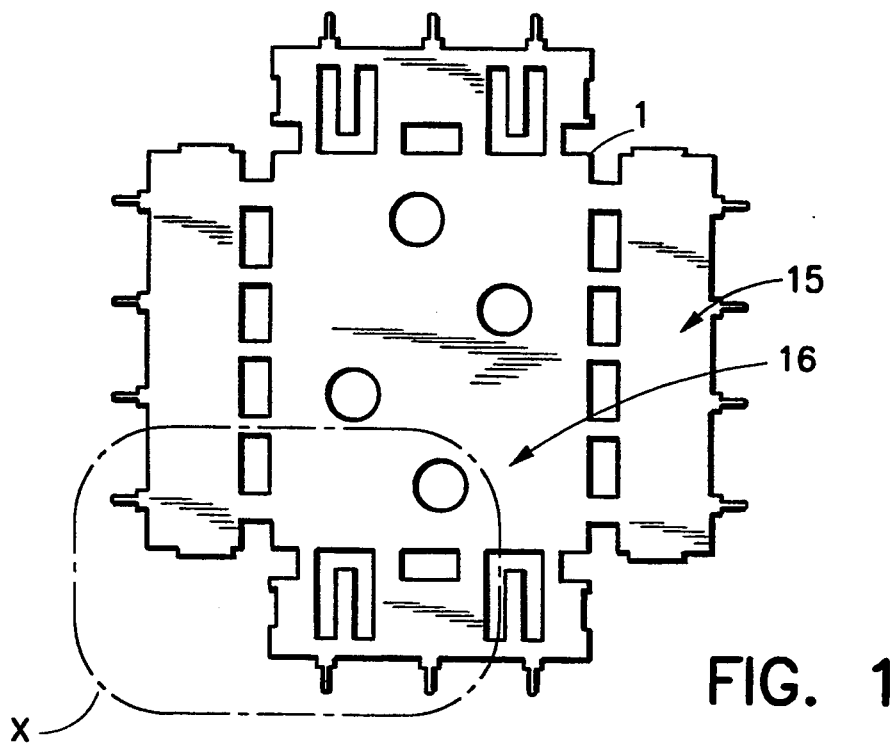
FIG. 1 shows a preform cut off from thin metal plate for an EMC enclosure according to the invention.

FIG. 1 shows a preform 1 cut off from a thin metal plate for an EMC enclosure according to the invention. E.g. nickel silver plate can be used as the metal plate ($s=0,3$ mm).

Figure 2:
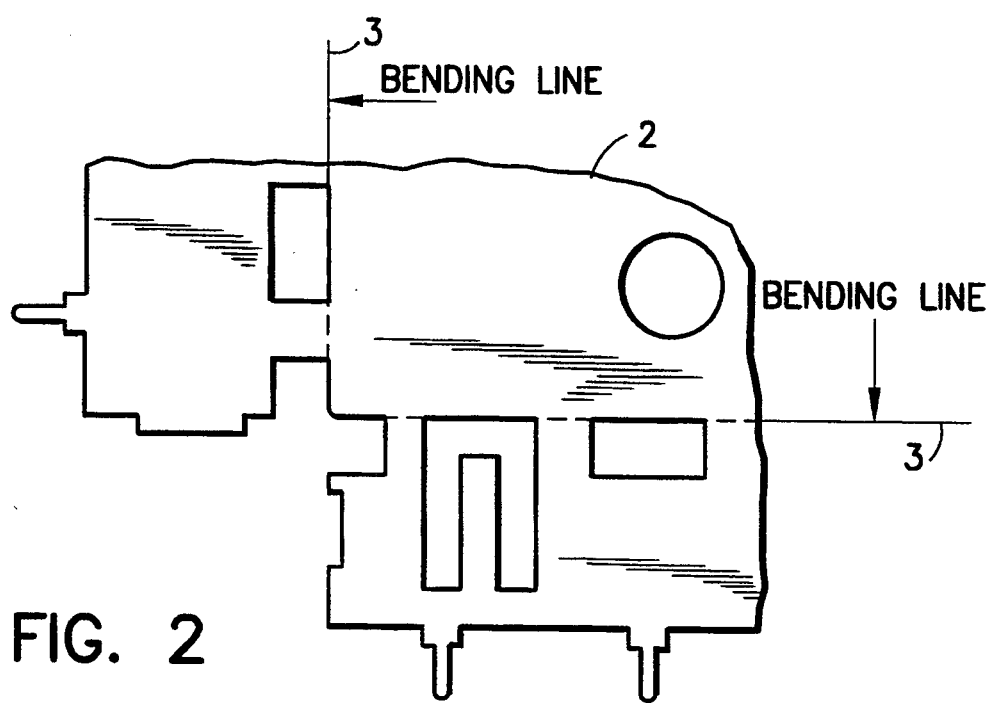
FIG. 2 shows an enlarged part of the preform.

FIG. 2 shows an enlarged part 2 of the preform, whereby the detailed structure of the preform appears more clearly. A completed EMC enclosure according to the invention is obtained when the preform sides are bent along the bending lines 3.

Figure 3A:
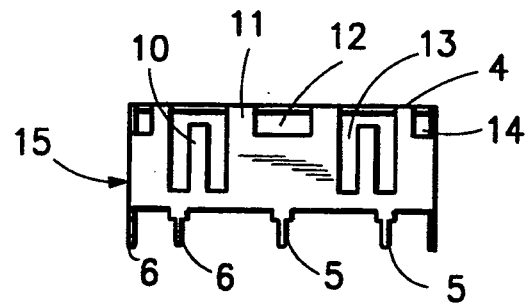
FIGS. 3A, 3B and 3C show an end view, a side view and a top view, respectively, of a completed EMC enclosure according to the invention.
Figure 3B:
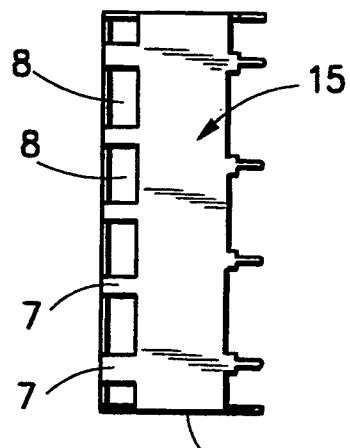
Figure 3C:
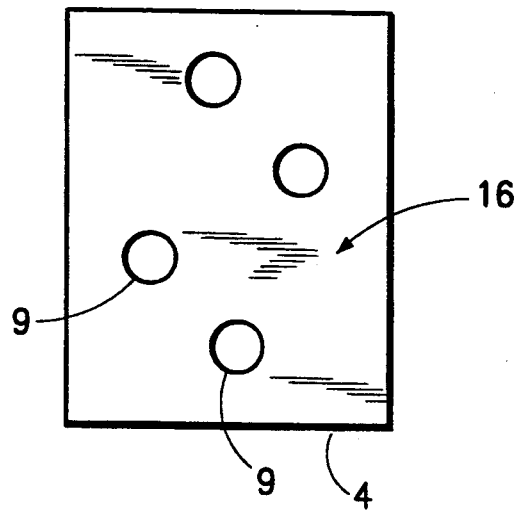

FIGS. 3A, 3B and 3C show a completed EMC enclosure 4 according to the invention. The enclosure 4 is wave soldered onto a circuit board with the aid of teeth 5. The enclosure can also be reflow-soldered, whereby the tooth 5 is perpendicularly cut off at the tooth shoulder 6, so that the shoulder acts as a surface mount contact fixed to the circuit board with the solder. When the enclosure is mounted the tooth shoulders 6 act as limiters leaving between the side wall and the circuit board a gap as a passage for signal conductors into and out from the enclosure, the conductors being formed by foils on the circuit board surface.

When the enclosure has been fastened to the circuit board it is possible to open the cover of the enclosure 4 by cutting the necks 7, 11 on three sides. Then the edge between the cover and the fourth side acts as a hinge. Side-cutting pliers or a suitable tool can be used to cut off the necks 7, 11, the cutting edges of the tool being pushed a bit through the openings 8, 12, 13, 14.

The opened cover can be closed by turning it into its original position and by soldering together the cut-off necks 7, 11. For the closing it is also possible to use a separate repair cover, which is soldered or otherwise fastened to the enclosure 4. Then the necks 7, 11 are cut off at four sides and the original cover is removed.

The holes 9 shown in FIG. 3C are for the adjustment of trimmers inside the enclosure 4. The trimmers can be adjusted with an adjustable spanner which is inserted through a hole 9. The holes are made symmetrical to the axis of the enclosure, whereby the enclosure has no mounting polarity.

A part of the openings in FIG. 3A are made in a U-form 13, so that the strips 10 formed thereby can be bent to form brackets for a cable passing along the ends of the enclosure 4.

The dimensions of the necks 7, 11 have an effect on the protective characteristics of the enclosure, so that the smaller inductance the neck 7, 11 has, and the more there are necks 7, 11, the lower impedance the neck 7, 11 will have and the better protective effect there will be. The inductance of the neck 7, 11 decreases when the neck 7, 11 is shortened and broadened.

The holes 9 in the enclosure 4 decrease the attenuation of the enclosure 4 according to the approximative formula below, whereby the biggest hole 9 is the effective hole:

$A = 97 \text{ dB} - 10 \lg(l*w*f*f)$ in which
l = length of the hole, in millimeters
w = width of the hole, in millimeters
f = effective frequency, in MHz Due to the enclosure according to the invention no separate cover is needed. There will be no extra component item, which saves material coats, labour costs and component costs. In an enclosure 4 according to the invention the cover material is obtained from the central part of the same plate, out of which the frames are cut off. There is neither a separate mounting phase for the cover, so it will not give rise to any labour costs.

In the enclosure 4 according to the invention the cover makes the contact via the necks 7, 11, which is substantially better than the prior solution. The neck 7, 11 is of continuous material without easily oxidating connection points. The enclosure 4 according to the invention is far more reliable than prior enclosures.

I claim:

1. An electromagnetic compatibility enclosure with side walls (15) and a cover (16) used for providing component protection in an electrical apparatus, characterized in that the side walls (15) and the cover (16) are formed of a same plate preform by bending, and that there is an arrangement in a bending area (3) between the cover (16) and the side walls (15) for opening and closing the enclosure (4), wherein the arrangement on three sides between the cover and the side walls comprises necks (7, 11) and openings (8, 12, 13, 14) between the necks and, at least a part of the openings are made in a U-form (13), so that strips (10) formed thereby can be bent to form brackets for a cable passing along an end of the enclosure (4).

2. An electromagnetic compatibility enclosure as claimed in claim 1, wherein the cover of the electromagnetic compatibility enclosure (4) can be opened when the necks (7, 11) on three sides are cut off, whereby the edge between the cover and a fourth side acts as a hinge.

3. An electromagnetic compatibility enclosure as claimed in claim 1, wherein the arrangement on a fourth side between the cover and the side walls comprises necks (7, 11) and openings (8, 12, 13, 14) between the necks.

4. An electromagnetic compatibility enclosure as claimed in claim 1, wherein there are adjustment trimmer holes (9) in the cover for inserting an adjustment spanner through the holes (9) to adjust trimmers of a component enclosed by the electromagnetic compatibility enclosure.

5. An electromagnetic compatibility enclosure as claimed in claim 1, wherein teeth (5) extend from a lower edge of the side walls in the direction of the walls.

6. An electromagnetic compatibility enclosure as claimed in claim 5, wherein the teeth (5) have shoulders (6), wherein the teeth can be cut off at the shoulders (6) for fastening the shoulders as surface mount contacts to a circuit board with the aid of solder.

7. An electromagnetic compatibility enclosure comprising a frame (1) having a general U-shaped aperture (13) extending therethrough, the aperture (13) defining a strip (10) of the frame (1) that is deformable for retaining a cable on the frame (1) wherein the frame (1) includes side walls (15) and a cover (16), the frame (1) having necks (7, 11) and openings (8,12, 14) between the necks at a junction (3) between the side walls (15) and the cover (16).

8. An electromagnetic compatibility enclosure as in claim 7 wherein the frame (1) has a plurality of the general U-shaped apertures (13) on different walls (15) of the frame (1).

9. An electromagnetic compatibility enclosure as in claim 7 wherein the frame (1) is comprised of a one-piece metal preform made from a metal plate that is cut and deformed to form the enclosure.

10. An electromagnetic compatibility enclosure as in claim 7 wherein the frame (1) includes teeth (5) extending from a lower edge of side walls (15) of the frame (1).

11. An electromagnetic compatibility enclosure as in claim 10 wherein the frame (1) includes shoulders (6) at bases of the teeth (5), wherein the teeth (5) can be removed for surface mounting the shoulders (6) onto a printed circuit board.

* * * * *